(12) United States Patent
Sinanoglu

(10) Patent No.: US 8,726,109 B2
(45) Date of Patent: May 13, 2014

(54) ARCHITECTURE, SYSTEM, METHOD, AND COMPUTER-ACCESSIBLE MEDIUM FOR ELIMINATING SCAN PERFORMANCE PENALTY

(75) Inventor: Ozgur Sinanoglu, New York, NY (US)

(73) Assignee: New York University, New York, NY (US)

( * ) Notice: Subject to any disclaimer, the term of this patent is extended or adjusted under 35 U.S.C. 154(b) by 239 days.

(21) Appl. No.: 13/462,139

(22) Filed: May 2, 2012

(65) Prior Publication Data

US 2012/0284577 A1 Nov. 8, 2012

Related U.S. Application Data

(60) Provisional application No. 61/481,403, filed on May 2, 2011.

(51) Int. Cl.
*G01R 31/28* (2006.01)
(52) U.S. Cl.
USPC .......................................... 714/727; 714/729

(58) Field of Classification Search
USPC .............. 703/19; 714/26, 725, 726, 727, 729, 714/733
See application file for complete search history.

(56) References Cited

U.S. PATENT DOCUMENTS

| | | | |
|---|---|---|---|
| 6,536,008 B1 * | 3/2003 | Nadeau-Dostie et al. ..... | 714/726 |
| 6,567,943 B1 * | 5/2003 | Barnhart et al. ............... | 714/727 |
| 6,694,464 B1 * | 2/2004 | Quayle et al. .................. | 714/725 |
| 7,543,207 B2 * | 6/2009 | Chua-Eoan et al. ........... | 714/726 |
| 7,739,097 B2 * | 6/2010 | Sample et al. .................. | 703/19 |
| 7,917,819 B2 * | 3/2011 | Talayssat et al. .............. | 714/727 |

* cited by examiner

*Primary Examiner* — David Ton
(74) *Attorney, Agent, or Firm* — Andrews Kurth LLP

(57) ABSTRACT

Exemplary apparatus, methods, and computer-accessible medium can be provided for transforming a circuit. For example, it is possible to select, from the circuit, at least one scan cell which includes a first multiplexer coupled to a first flip-flop. A second flip-flop and a second multiplexer can be inserted in the circuit. The first multiplexer can be coupled as an input to the second flip-flop, and the second multiplexer can be coupled to the output of the first flip-flop and the second flip-flop.

18 Claims, 7 Drawing Sheets

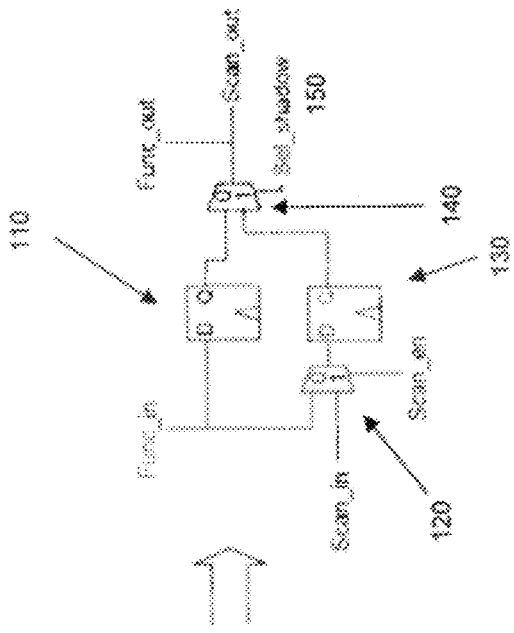
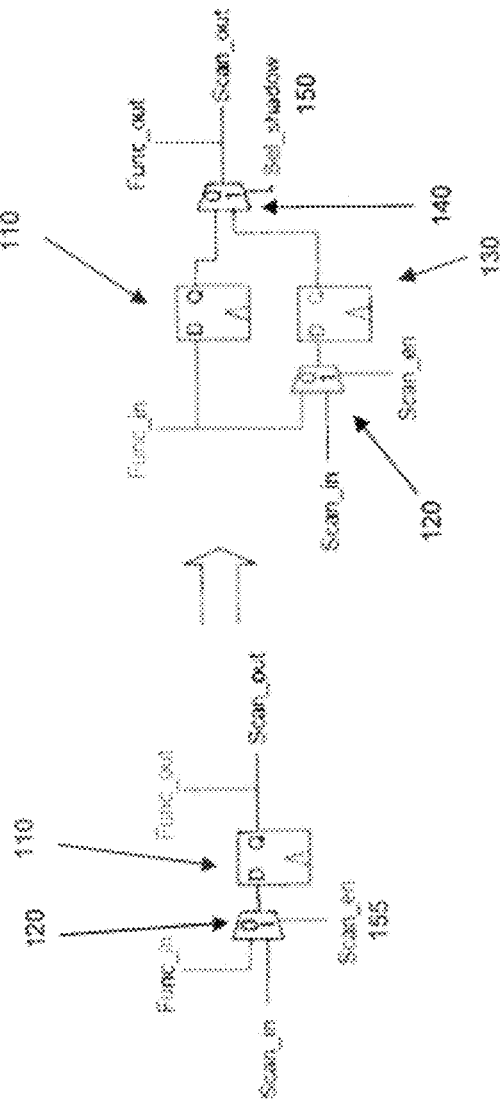

ARCHITECTURE, SYSTEM, METHOD, AND COMPUTER-ACCESSIBLE MEDIUM FOR ELIMINATING SCAN PERFORMANCE PENALTY

CROSS-REFERENCE TO RELATED APPLICATION(S)

This application claims priority from U.S. Provisional Patent Application No. 61/481,403, filed on May 2, 2011, which is hereby incorporated by reference in its entirety.

FIELD OF THE DISCLOSURE

Exemplary embodiments of the present disclosure relate to testing of integrated circuits, and more specifically to exemplary embodiments of architectures, apparatus, methods, and computer-accessible medium for transforming a circuit for test.

BACKGROUND INFORMATION

Stringent performance requirements can magnify the impact to performance degradation induced by Design-for-Testability (DfT) techniques. Controllability and observability of each flip-flop has typically been ensured via an insertion of a scan multiplexer yet at the expense of functional path prolongation by a multiplexer delay. While such a transformation on every flip-flop can eliminate the sequentiality of the test generation problem, critical path prolongation and thus functional speed degradation can be the end-result, undermining the expected fulfillment of the stringent performance requirements. As more aggressive performance optimizations are being employed, resulting in high-performance designs with reduced logic depth, the impact of scan multiplexers can be even more magnified.

Traditionally, partial scan has been an approach for eliminating/alleviating the performance penalty of scan. Research has been conducted in partial scan designs, typically targeting the removal of scan multiplexers on a set of selected flip-flops. The consequent benefit can be potential alleviation of the performance penalty of scan, in addition to other benefits such as test time, e.g., data volume and power reduction. The previously described techniques in partial scan can be classified mainly into three categories, e.g.: structure-based techniques that typically involve breaking the cycles and/or reducing scan depth, testability-based techniques that can select scan flip-flops based on testability improvements, and test generation-based techniques which can intertwine test generation and scan flip-flop selection. Other partial scan techniques can include those driven by layout constraints, timing constraints, re-timing, and toggling rate of flip-flops and entropy measures. These traditional techniques typically necessitate the utilization of sequential ATPG (or combinational ATPG with time frame expansion), however, to generate test patterns on a partially scanned design, which can not only fail to comply with the existing design/test flow that industry utilizes, but also can be incapable of ensuring the quality of full scan.

Accordingly, there can be a need to address and/or overcome at least some of the above described deficiencies and issues.

SUMMARY OF EXEMPLARY EMBODIMENTS

According to certain exemplary embodiments of the present disclosure, exemplary architectures, apparatus, methods, and computer-accessible medium for a scan cell transformation can be provided that can, for example, move the scan multiplexer from the input of the flip-flop to its output, removing the scan multiplexer delay off the critical paths. By inserting a number of shadow flip-flops properly, for example, the exemplary transformation procedure can retain test development (e.g., test data, quality, etc.) and application (e.g., test time, power dissipation, etc.) intact, while fully complying with the conventional design and test flow. Exemplary experimental results can justify the efficacy of the exemplary procedures in eliminating the performance penalty of scan quickly and cost-effectively, and thus in enhancing functional speed of integrated circuits.

Certain exemplary embodiments of the present disclosure can provide a transformation procedure that can include transferring the scan multiplexer from the input of the flip-flop to its output for a target set of flip-flops, in order to remove the multiplexers off from (near) critical paths. For each transformed flip-flop, a shadow flip-flop can be inserted in such a way that any type of test can still be applied intact with the cost-quality metrics fully preserved. Thus, by inserting a few additional flip-flops, for example, penalty of scan can be substantially eliminated while retaining test patterns and test application process intact. In this exemplary manner, the functional performance of integrated circuits can be further improved. To summarize, certain exemplary procedures can include, e.g.:

eliminate the performance penalty of scan;
retain test development process (test data, quality, pattern count) intact;
retain test application process (static, at-speed tests) intact;
be orthogonal to and can be utilized in conjunction with any other DfT approach (test compression, test power reduction, etc.).

Exemplary embodiments of the present disclosure can provide a scan cell transformation procedure that can, for example, substantially eliminate the performance penalty of scan. The exemplary procedure can include transferring the multiplexer from the input of the flip-flop to its output, shortening the critical path. The exemplary procedure can restore controllability and observability by, for example, inserting shadow flip-flops through which scan operations can be conducted, while fully retaining the test patterns and test application process intact; these transformations can incur an area cost of less than 0.1% for larger designs. The performance penalty of scan can be eliminated quickly and cost-effectively. Thus, and as the exemplary procedure can comply with the conventional design and test flow, it can be utilized to attain significant functional performance enhancements especially for high-performance designs.

According to certain exemplary embodiments of the present disclosure, systems, methods, and computer readable mediums can be provided for transforming a circuit including. For example, it is possible to select, from the circuit, at least one scan cell which includes a first multiplexer coupled to a first flip-flop. It is also possible to insert a second flip-flop and a second multiplexer in the circuit. The first multiplexer can be coupled as an input to the second flip-flop, and the second multiplexer can be coupled to the output of the first flip-flop and the second flip-flop. In certain exemplary embodiments of the present disclosure, the second multiplexer can be configured to receive a control signal which is low during a first shift cycle and is high in at least one shift cycle following the first shift cycle and during a capture mode during an operation of the circuit.

According to further exemplary embodiments, it is also possible to shift out a content of the first flip-flop into a succeeding scan cell during at least one first shift cycle. It is also possible to shift out a content of the second flip-flop to the succeeding scan cell during at least one second shift cycle which follows the first shift cycle(s). Further, it is possible to capture, at the first and second flip-flops, a response bit, and receive, at the second flip-flop, an input from a preceding scan cell during each shift cycle.

In additional exemplary embodiments of the present disclosure, it is possible to identify a critical path of the circuit having a start point and an end point, determine whether the start point and the end point are the same, and if the scan cell at the end point includes a previous transformation, and terminate the iterative procedure if it is determined that the start point and the end point are the same and/or if the scan cell at the end point was previously transformed. For example, via the iterative procedure, it is also possible to determine whether the critical path is longer upon the transformation, and revert to a prior state of the transformation, and terminate the iterative procedure if it is determined that the critical path is longer upon transformation. According to still further certain exemplary embodiments of the present disclosure the start point and the end point can include scan cells.

These and other objects, features and advantages of the present disclosure will become apparent upon reading the following detailed description of embodiments of the present disclosure.

BRIEF DESCRIPTIONS OF THE DRAWINGS

Further objects, features and advantages of the present disclosure will become apparent from the following detailed description taken in conjunction with the accompanying Figures showing illustrative embodiments of the present disclosure, in which:

FIG. 1A is a schematic diagram of a scan circuit according to an exemplary embodiment of the present disclosure;

FIG. 1B is a schematic diagram of a system providing an exemplary scan cell transformation according to certain exemplary embodiments of the present disclosure;

Figure 2:
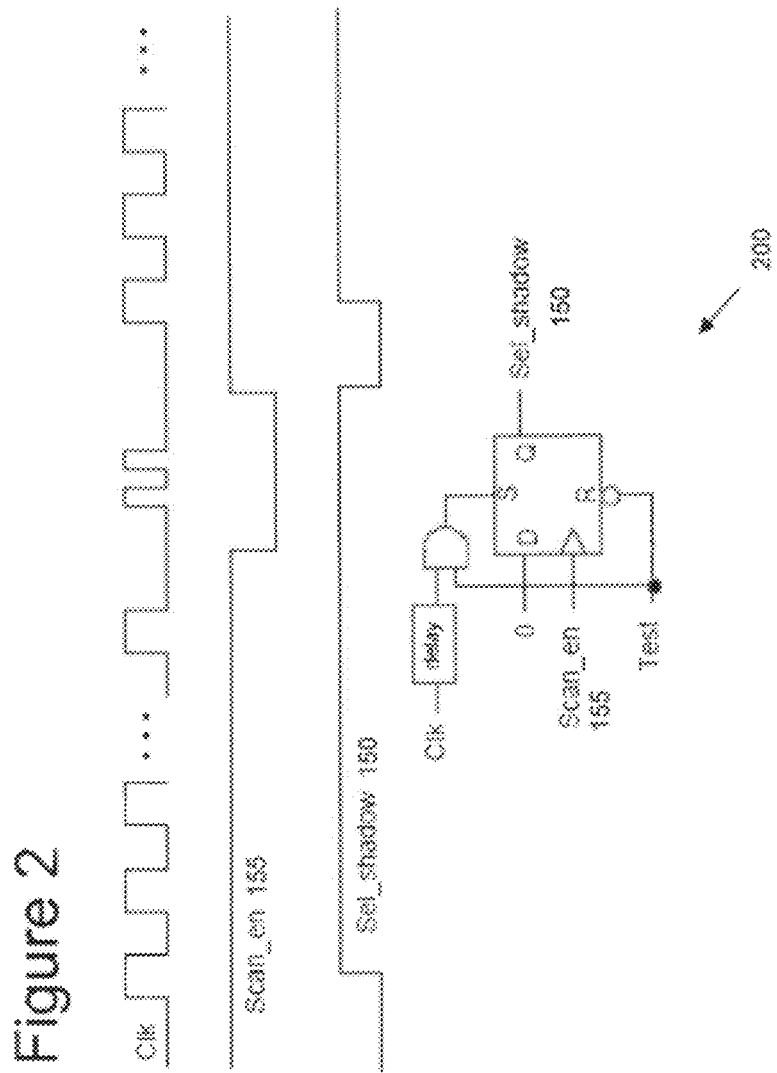
FIG. 2 is a schematic diagram of a system providing an exemplary timing and generation of a Sel_shadow signal according to certain exemplary embodiments of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures.

DETAILED DESCRIPTION OF EXEMPLARY EMBODIMENTS

Exemplary Scan Cell Transformation

According to certain exemplary embodiments of the present disclosure, exemplary architecture, apparatus, method, and computer-accessible medium for an exemplary transformation procedure can be provided. For example, the exemplary procedure can transfer the scan multiplexer from the input of the flip-flop to its output, which, with the support of a shadow flip-flop, can restore the controllability and observability loss, while fully retaining the test capabilities of a conventional scan flip-flop.

FIG. 1A illustrates a schematic diagram of a scan circuit with original flip-flop 110. FIG. 1B illustrates a schematic diagram of an exemplary system which can facilitate a utilization/application of the exemplary procedure on the original flip-flop 110, transferring the multiplexer 120 from the input of the flip-flop to its output. Because of the delay, e.g., due to the tap-off in front of the original flip-flop 110, replacing a multiplexer with the tap-off point can deliver a gain that may be slightly less than a multiplexer delay. Such exemplary transformation can provide for the insertion of a test-only shadow flip-flop 130 and a multiplexer 140 that can be driven by a Sel_shadow signal 150.

The exemplary transformed scan cell arrangement illustrated in FIG. 1B can operate as follows. For example, the original flip-flop 110 can capture the functional input fed by the combinational logic. The shadow flip-flop 130 can be used during a test mode (e.g., a typical TAP controller can generate two signals test and Scan_en). During the exemplary test mode, the test signal can be high, while it can be low during the normal mode. Further, the Scan_en signal can be high during the shift mode, and low during the capture mode. The shadow flip-flop 130 can latch the output of the preceding scan cell, e.g., when the scan enable signal Scan_en is high. During the shift mode, the shadow flip-flop 130 can be connected to the preceding scan cell. The shadow flip-flop 130 can latch output of the combinational logic when Scan_en is low. Further, during capture, both the original flip-flop 110 and the shadow flip-flop 130 of the same exemplary transformed scan cell can capture the response of the combinational logic.

The succeeding scan cell and the combinational logic can be both driven by the transferred multiplexer, which can select between the original and the shadow flip-flops based on the Sel_shadow signal. In the test mode, this signal can be high, e.g., except for the first shift cycle following the capture window. As a result, during the first shift cycle subsequent to the capture window, the original flip-flop can drive the scan-out signal, in this first exemplary shift cycle, the succeeding scan cell can receive its input from the original flip-flop. During the other shift cycles and capture window, the shadow flip-flop 130 can drive the combinational logic (e.g., during capture) and the succeeding scan cell in the scan chain (e.g., during all shift cycles but the first one). In addition, the Sel_shadow signal can be low during the normal mode, to ensure, e.g., that the functional operations can be carried out by selecting the original (and faster) flip-flop 120.

The Sel_shadow signal 150 can be generated out of the Scan_en signal 155 as shown, for example, using an exemplary system 200 in FIG. 2. In this exemplary circuitry, the test signal can be used to ensure that the original flip-flop 120 is selected (e.g., Sel_shadow=0) during the normal mode. In the test mode, an active clock can set the Sel_shadow signal. When the clock signal is inactive, a rising edge on the Scan_en signal (e.g., indicating the beginning of shift cycles) can reset Sel_shadow to 0. The first clock pulse during shift operations can set this signal back to 1, which can be preserved until the end of the next capture window. A delayed version of the clock can be utilized in order to facilitate and/or ensure, for example, that the signal remains low until after the first shift operation has been completed; the magnitude of this delay is preferably adjusted to overcome the clock skew. For example, the Sel_shadow signal may not be timing-sensitive; this signal can transition either when design switches from capture mode to shift mode (e.g., where dead-time is typically inserted) or between the first and second shift cycles (e.g., where the shift operations are typically conducted at a low speed). Therefore, this signal can be routed to the few transformed scan cells. In other exemplary embodiments, if the routing of this signal is a concern, it can be locally generated out of the Scan_en signal by utilizing the exemplary circuitry 200 in FIG. 2.

Figure 3:
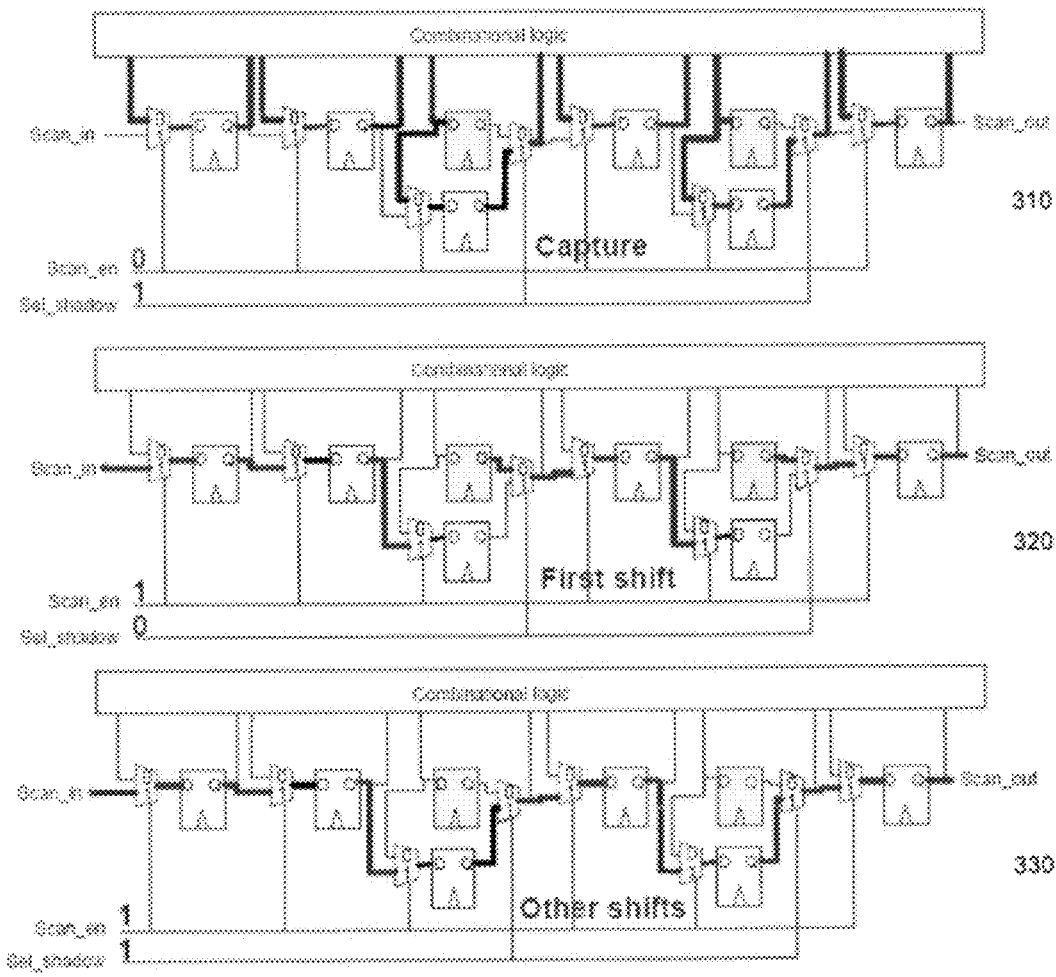
FIG. 3 is a schematic diagram of a system providing exemplary test operations in the presence of exemplary scan cell transformations according to further exemplary embodiments of the present disclosure.

The exemplary shift and capture mode operations are illustrated, for example, on a scan. chain example with two transformed scan cells implemented by an exemplary system shown in FIG. 3. As two scan cells (e.g., third and fifth from the left) are transformed in this example, two shadow flip-flops can be inserted through which scan operations can be carried out. The topmost part 310 shown in FIG. 3 illustrates the exemplary capture mode operation, whereas both the original and the shadow flip-flops can capture the output of the combinational logic, while the shadow flip-flop 130 can drive the combinational logic. The exemplary middle part 320 shown in FIG. 2 illustrates the first exemplary shift cycle subsequent to the capture window, whereas the shadow flip-flop 130 can be connected to the preceding scan cell, and the original flip-flop 110 can drive the succeeding scan cell. The bottommost part 330 shown in FIG. 2 illustrates the subsequent shift cycles, whereas the scan chain can logically go through the shadow flip-flops 130. The remaining combination, which can be, e.g., Scan_en=0 and Sel_shadow=0, can correspond to the functional mode operation, whereas the original flip-flop 110 can be logically connected to the combinational logic.

Exemplary Application Flow

The exemplary procedure can target flip-flops, for example, at the sink of the critical paths. The exemplary transformation can be applied on such a flip-flop, effectively transferring the multiplexer delay from the input of the flip-flop to its output, and thus off that critical path. Such a transformation can shorten the targeted critical path, while making other paths that stem from the transformed flip-flop longer. Thus, utilizing the exemplary transformation, the new exemplary critical paths can be identified, and the transformations can be applied on other flip-flops where the new critical paths terminate. This exemplary procedure can terminate, for example, when no further performance improvement can be achieved.

Figure 4:
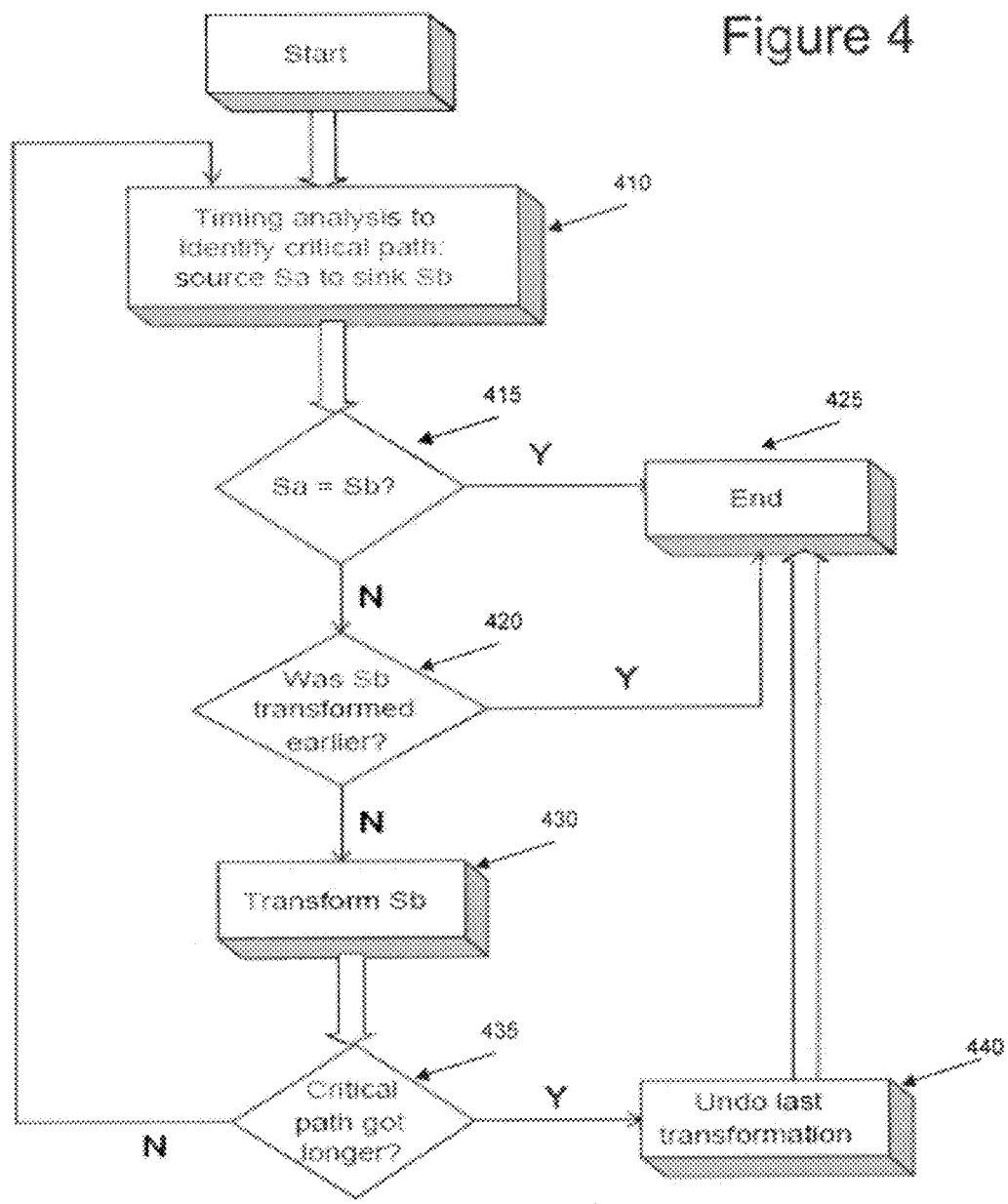
FIG. 4 is an flow diagram of a method or procedure according to certain exemplary embodiments of the present disclosure providing an iterative application flow.

FIG. 4 illustrates an exemplary iterative application flow diagram for the exemplary procedure according to certain exemplary embodiments of the present disclosure. In each iteration, e.g., a static timing analysis tool can identify the new critical path in the design-block 410. Unless the critical path originates and terminates at the same flip-flop, e.g., as tested at block 415, or the sink scan cell has already been transformed in earlier iterations, e.g., as tested at block 420, in which case the procedure can terminate at block 425, the scan cell at the sink of the critical path can be transformed at block 430 by applying the changes illustrated in FIGS. 1A and 1B. It may be possible that the transformation can render a near-critical path (e.g., stemming from the sink scan cell) longer than the current critical path (e.g., as tested at block 435); in this case, this last transformation can be undone at block 440, and the exemplary procedure can terminate at block 425. If the critical path did not become longer (e.g., as tested at 435), the exemplary procedure can return to another iteration at block 410.

Figure 5:
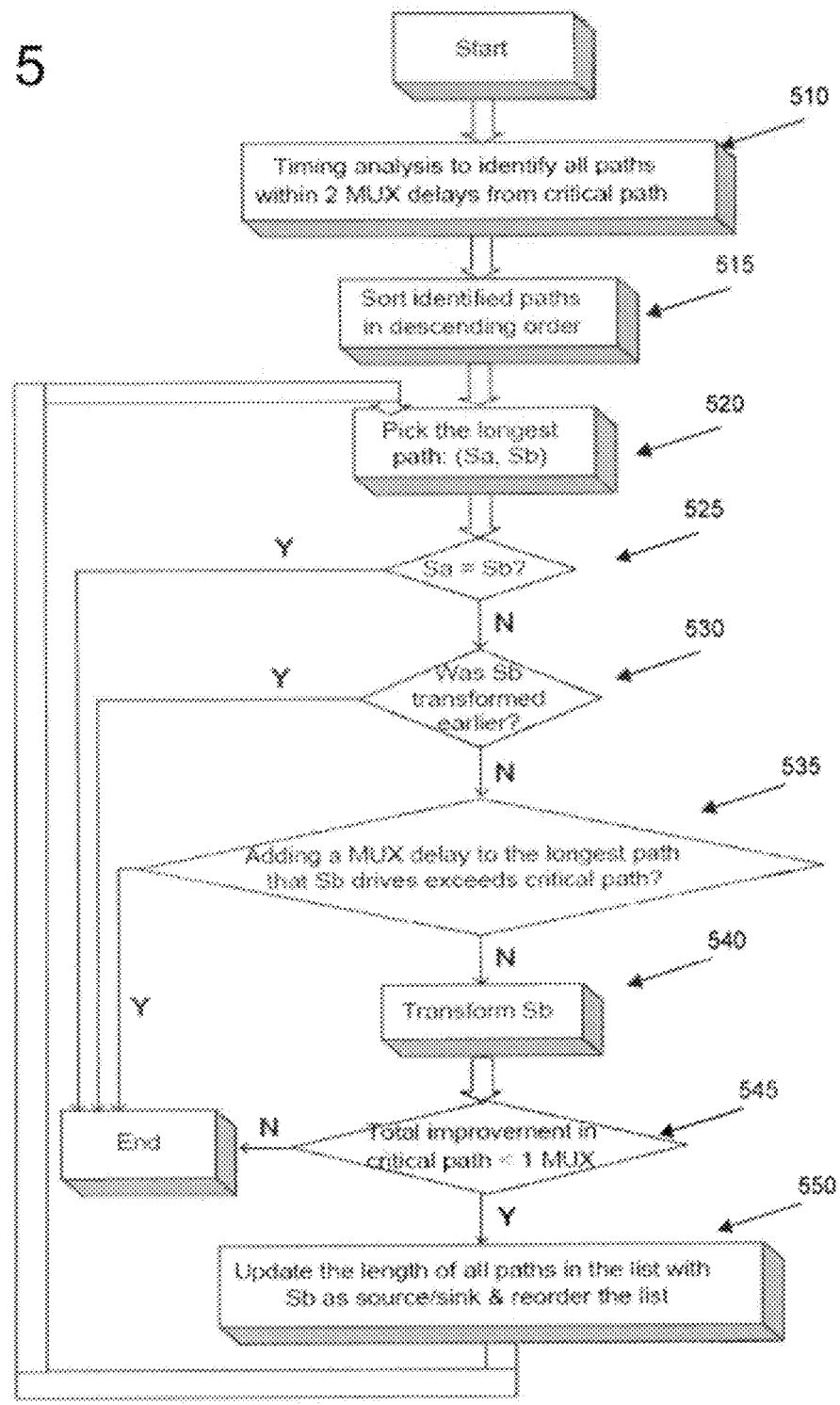
FIG. 5 is an flow diagram of another method or procedure according to further exemplary embodiments of the present disclosure providing a cumulative application flow.

While the exemplary iterative flow can be accurate timing-wise, a repetitive application of the timing analysis tool can be computationally costly. According to yet another exemplary embodiment of the present disclosure, an alternative flow, which can be referred to as the cumulative flow, can be provided, for example, as shown in a flow diagram of FIG. 5. In this exemplary alternative flow, the timing analysis can be executed once at block 510 to identify the near-critical paths that are preferably included in the analysis. As paths can be shortened or prolonged by a multiplexer delay, the paths under analysis can be those within two multiplexer delays from the longest path. Subsequently, the exemplary procedure can sort the identified paths in descending order at block 515, and be dynamically applied to shorten the paths, for example, one at a time, starting from the longest path at block 520. When a flip-flop is transformed at block 540 (e.g., via blocks 525, 530, and 535), the length of the paths affected by this transformation can be updated and the list can be sorted again block 550. The termination condition can be substantially the same as in the exemplary iterative flow, except that the critical path improvement of a complete multiplexer delay can also terminate the exemplary procedure (e.g., at block 545), successfully in this case as this can be the best case scenario.

Figure 6:
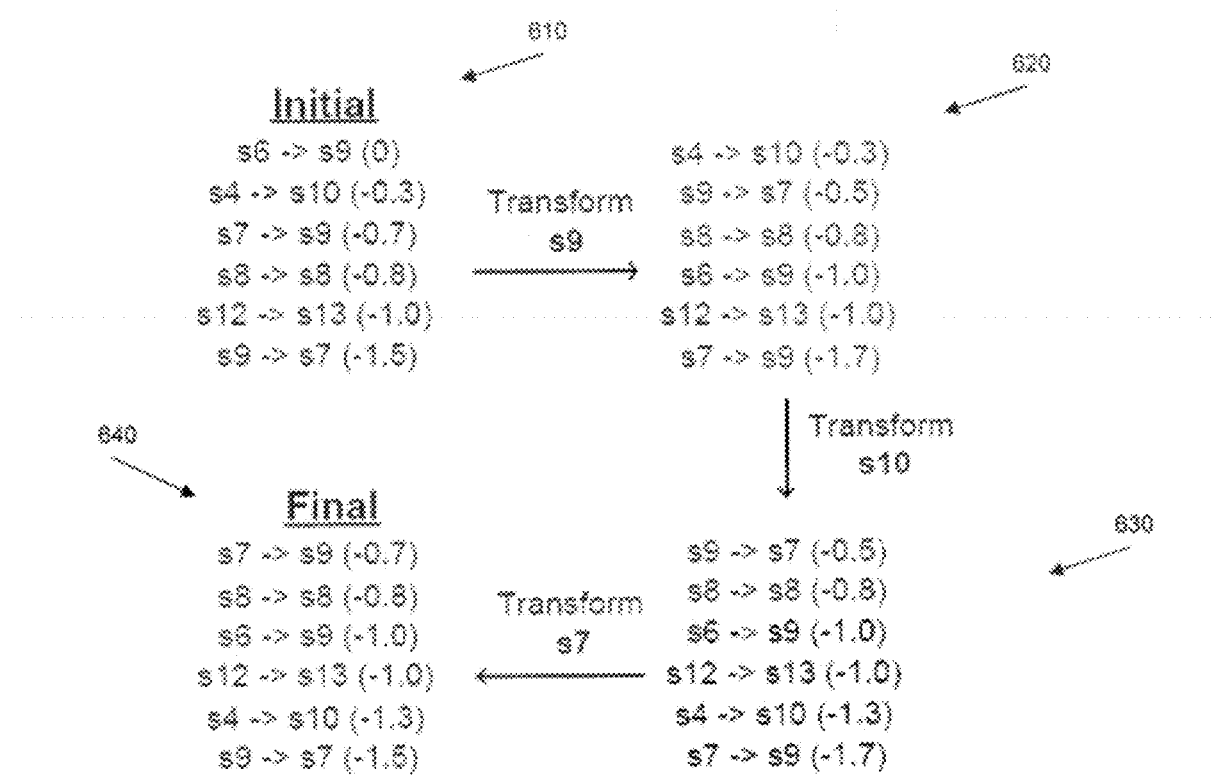
FIG. 6 is an illustration of an exemplary application of an exemplary cumulative application flow according to certain exemplary embodiments of the present disclosure.

The application of the exemplary cumulative flow on an example is illustrated in FIG. 6. The top-left part 610 illustrated in FIG. 6 shows, for example, the exemplary output of the timing analysis tool which can list the six near-critical paths that can potentially become the final critical path upon transformations. For each path, the source and the sink scan cells can be provided in addition to the difference of the near-critical path length from the critical path length in parenthesis. This exemplary length difference can be given as a multiple of one multiplexer delay. For example, a good gain in this example can be 0.8 multiplexer delay, as the exemplary procedure may not be able to improve the path that originates and terminates at s8.

In the first exemplary iteration, s9 can be successfully transformed, as the longest path stemming from s9 (s9 to s7) can remain below the critical path despite the prolongation by a multiplexer delay. This transformation can be reflected to the list of paths by updating the length of the three paths affected, e.g., two shortened and one prolonged. In the second iteration, s10 can be transformed, changing the length of the currently longest path in the list. In the third iteration, the exemplary procedure can include transforming s7, affecting the length of two paths in the list. This transformation can increase the length of the s7 to s9 path to a value under the length of the longest path. The fourth iteration can be when the exemplary procedure terminates, as s9 was already transformed in the first iteration. The critical path of the design can be thus improved by 0.7 multiplexer delay.

The timing accuracy of the exemplary iterative flow and the computational efficiency of the exemplary cumulative flow can be combined in a hybrid flow for the application of the exemplary transformation procedures, wherein the timing analysis tool can be executed once upon every n cumulative transformations. This way, the timing information can be refreshed with every n transformations, rather than performing the transformations based on a single timing analysis run. The value of n can be chosen properly depending on the desired levels of timing accuracy and computational efficiency.

Exemplary Test Quality Considerations

Typically, in conventional scan-based testing, scan flush test is generally applied by running a few patterns through the scan chain with no capture operation in between. According to exemplary embodiments of the present disclosure, these patterns can be shifted through a scan chain that traverses the untransformed scan cells and the shadow flip-flops (e.g., a single dummy clock pulse may be required prior to the clock pulses in order to set the Sel_shadow signal to 1; both Scan_en and Sel_shadow signals can be high throughout scan flush testing) of transformed scan cells, e.g., as illustrated in bottommost part 330 of FIG. 3. In this manner, the faults on the scan path can be covered as in the conventional scan flush testing. As the scan path typically does not traverse the transformed (original) flip-flops, the faults on their input and output may not be covered during scan flush testing, however, which will be described herein below.

Scan load/unload operations can be performed slightly differently compared to conventional scan-based testing, where a difference can be that the first shift cycle subsequent to capture window, as illustrated in FIG. 3, the succeeding scan cell in the chain can receive the value captured in the original flip-flop. Upon the completion of the shift operations, the chain can be loaded with the new stimulus (e.g., through the untransformed scan cells and the shadow flip-flops of transformed scan cells) while the content of the original flip-flops can have been unloaded and observed in substantially the same manner as in conventional testing.

In static (e.g., stuck-at fault) testing, the stimulus loaded into the untransformed scan cells and the shadow flip-flops of transformed scan cells can be applied to the circuit under test, while the flip-flops (e.g., all the flip-flops) capture; the original and shadow flip-flop of a transformed scan cell can capture the fault-free bit. The faults at the input of the original flip-flop, which can remain undetected upon scan flush testing, can manifest in the original flip-flop upon capture, and can be detected by the end of the shift cycles, as the content of the original flip-flop is shifted into the succeeding scan cell in the first shift cycle. Also, as the patterns are loaded and applied, and the responses are unloaded and observed, the same set of faults in the combinational logic can be covered as in conventional testing.

In launch-off-capture testing, upon the loading of the stimulus pattern into the untransformed scan cells and the shadow flip-flops of transformed scan cells, transitions can be launched from untransformed scan cells and the shadow flip-flops, and captured in the flip-flops. Upon the first capture operation (e.g., transition launch) the content of the original and the shadow flip-flops of a transformed scan cell can become substantially identical (e.g., as they both capture the same value), and transitions can be fired from the untransformed scan cells and the shadow flip-flops. The second capture operation can facilitate testing of the at-speed operation of the paths terminating at the original flip-flops as their content is shifted out and observed. Therefore, substantially the same set of transition faults in the combinational logic can be covered as in conventional testing.

In launch-off-shift testing, transitions can be launched from untransformed scan cells and the shadow flip-flops. The Scan_en signal can switch from high to low at-speed, and these transitions can propagate into both the original and the shadow flip-flops, while the content of the original flip-flops can be shifted out and observed, covering substantially the same set of transition faults in the combinational logic as in conventional testing. Furthermore, the timing-sensitive signal is preferably still the Scan_en signal, as there is typically no at-speed timing requirement imposed on the Sel_shadow signal. Thus, the exemplary transformations can retain both the test quality and the timing requirements intact.

The faults covered differently compared to conventional testing can be those at the output of the original flip-flops, which can remain undetected upon scan flush testing. In conventional scan chains, scan flush testing can cover these faults, while according to the exemplary transformations, they can be detected indirectly. A fault on the output of the original flip-flop, if activated, can be captured in the succeeding scan cell upon the first shift cycle, and can be shifted out and detected in the observed responses. Its activation can be guaranteed as throughout the course of testing, the original flip-flop can capture either binary value at some point, activating either stuck-at fault on the output of the original flip-flop. Therefore, these faults can be assumed to be covered, preferably necessitating no additional test generation effort expended for them. It can be noted that in conventional testing, there can be other faults that can be detected indirectly, similar to the output faults of the original flip-flops: stuck-at-1 faults on the Scan_en wire attached to a scan cell. Whenever a scan cell with such a fault captures a value (e.g., from combinational logic) that differs from the value shifted into its preceding scan cell, this fault can be indirectly detected. None of these faults necessarily needs to be considered in test generation, as their indirect detection can be guaranteed.

Slight test generation and design effort can be expended into the detection of the transition faults on the output of the original flip-flops, however. With the design support capable of feeding a clock pulse, for example, to the original flip-flop of the transformed scan cells upon the completion of shift cycles. The pattern to be loaded into the untransformed scan cells and shadow flip-flops can be the two patterns merged together, e.g.: the pattern for stuck-at-v fault on the original flip-flop input and the pattern for the transition fault (from v' to v) at the output of the original flip-flop. This way, the pre-capture pulse can justify the original flip-flop to v' prior to double-capture, a single pulse may justify the original flip-flop to the desired value prior to the double capture that can launch the transition from the original flip-flops and capture them in the flip-flops. These special patterns can require Shadow_sel to be low during capture mode to enable transition launch from the original flip-flop.

As both the test data/quality and the number of shift cycles can remain intact upon the exemplary transformations, the performance enhancement benefits can be reaped transparently.

Exemplary Experimental Results

Exemplary experiments utilizing/applying/implementing certain exemplary embodiments of the present disclosure have been performed on various ISCAS89 and ITC99 benchmark circuits to gauge the performance savings that can be delivered. In the exemplary experiments, a netlist tracing tool can be implemented to identify the critical paths, and to measure their lengths. In the netlist tracing tool, static delays can be utilized for gates obtained from, e.g., an sdf file, implementing the cumulative application flow discussed earlier. The iterative execution of the static timing analysis can be integrated into an exemplary framework, e.g., delivering more accurate performance saving results. Subsequently, a few scan cells were transformed, for example, by making the proper changes in the netlist.

Table 1 provides the exemplary results of the exemplary procedure. Columns 2 and 3 indicate the number of total and transformed flip-flops, respectively, Column 4 denotes what portion of a multiplexer delay has been saved by the exemplary transformation procedure, while the corresponding percentage improvement in overall functional performance is given in column 5. Finally, columns 6 and 7 provide the percentage area cost, which can be measured by a weighted gate count (e.g., gate count multiplied by the average fanin), of the base case that includes the scan overhead, and computational run-time in seconds.

TABLE 1

Results of the proposed technique.

| Circuit | # scan cells | # trans. cells | % MUX-delay saving | % Overall Perf. Imp. | % Area Cost | Runtime (s) |
|---|---|---|---|---|---|---|
| s713 | 19 | 6 | 100 | 4.0 | 10.0 | <1 |
| s953 | 29 | 10 | 100 | 12.5 | 10.7 | <1 |
| s1423 | 74 | 3 | 100 | 3.4 | 2.1 | <1 |
| s5378 | 179 | 1 | 100 | 8.9 | 0.4 | <1 |
| s9234 | 228 | 2 | 100 | 4.2 | 0.3 | <1 |
| s13207 | 669 | 2 | 100 | 4.0 | 0.2 | 2 |
| s15850 | 597 | 2 | 100 | 3.0 | 0.2 | 34 |
| s35932 | 1728 | 0 | 0 | 0.0 | 0.0 | 7 |
| s38417 | 1636 | 1 | 100 | 5.2 | <0.1 | 12 |
| s38584 | 1452 | 1 | 100 | 4.4 | <0.1 | 11 |
| b20 | 490 | 2 | 100 | 2.8 | 0.1 | 26 |
| b21 | 490 | 3 | 100 | 2.8 | 0.1 | 25 |
| b22 | 735 | 3 | 100 | 2.8 | 0.1 | 41 |

The exemplary procedure can deliver a multiplexer delay saving (e.g., assuming that the delay of a tap-off point is negligible), and thus can eliminate the penalty of scan in the circuits except for s35932. For the two smallest circuits, the exemplary procedure can end up transforming 6 and 10 flip-flops, respectively, which can necessitate the insertion of this many flip-flops and multiplexers. For the other designs, however, at most 3 flip-flops and multiplexers can be inserted to reap the benefit of saving a multiplexer delay and improving performance.

For s35932, e.g., no improvement can be delivered, as the critical path originates and terminates at the same flip-flop. The exemplary procedure can run within a minute for the remaining benchmark circuits and can achieve its goal fully for these cases. The transformation of a few scan cells can incur an area cost of less than 0.1% for the larger designs, which can be quite negligible. The overall improvement in functional performance of the design can vary between 3% and 13%; for high performance designs where one multiplexer delay can constitute a significant portion of the functional cycle time, the exemplary procedure can be useful in eliminating this penalty quickly and cost-effectively.

Exemplary Embodiment of Exemplary System

Figure 7:
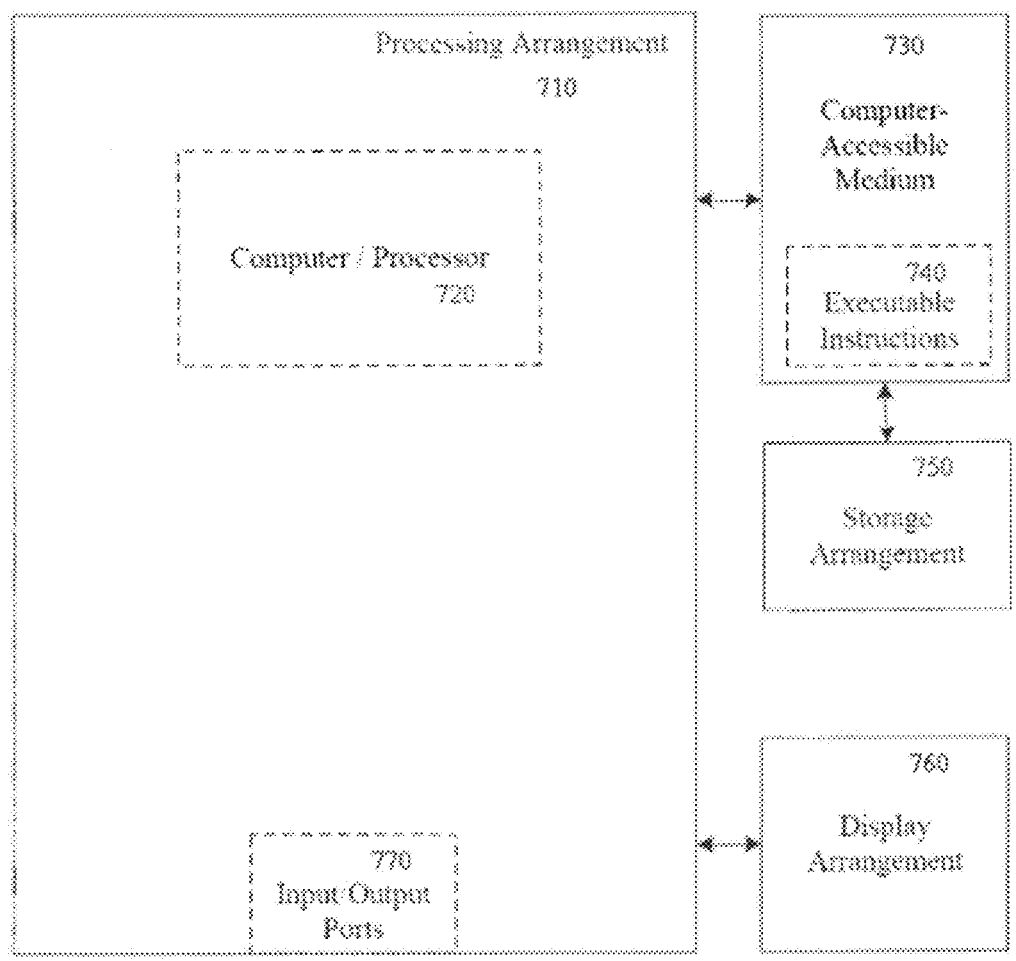
FIG. 7 is an illustration of an exemplary block diagram of an exemplary system in accordance with certain exemplary embodiments of the present disclosure.

FIG. 7 shows an exemplary block diagram of an exemplary embodiment of a system according to the present disclosure. For example, exemplary procedures in accordance with the present disclosure described herein can be performed by a processing arrangement and/or a computing arrangement 702. Such processing/computing arrangement 702 can be, e.g., entirely or a part of, or include, but not limited to, a computer/processor 704 that can include, e.g., one or more microprocessors, and use instructions stored on a computer-accessible medium (e.g., RAM, ROM, hard drive, or other storage device).

As shown in FIG. 7, e.g., a computer-accessible medium 706 (e.g., as described herein above, a storage device such as a hard disk, floppy disk, memory stick, CD-ROM, RAM, ROM, etc., or a collection thereof) can be provided (e.g., in communication with the processing arrangement 702). The computer-accessible medium 706 can contain executable instructions 708 thereon. In addition or alternatively, a storage arrangement 710 can be provided separately from the computer-accessible medium 706, which can provide the instructions to the processing arrangement 702 so as to configure the processing arrangement to execute certain exemplary procedures, processes and methods, as described herein above, for example.

Further, the exemplary processing arrangement 702 can be provided with or include an input/output arrangement 714, which can include, e.g., a wired network, a wireless network, the internet, an intranet, a data collection probe, a sensor, etc. As shown in FIG. 7, the exemplary processing arrangement 702 can be in communication with an exemplary display arrangement 712, which, according to certain exemplary embodiments of the present disclosure, can be a touch-screen configured for inputting information to the processing arrangement in addition to outputting information from the processing arrangement, for example. Further, the exemplary display 712 and/or a storage arrangement 710 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

What is claimed is:

1. A non-transitory computer-readable medium for transforming a circuit including instructions thereon that are accessible by a hardware processing arrangement, wherein, when the processing arrangement executes the instructions, the processing arrangement is configured to perform procedures comprising:

selecting, from the circuit, at least one scan cell which includes a first multiplexer coupled to a first flip-flop; and inserting a second flip-flop and a second multiplexer in the circuit,
wherein the first multiplexer is coupled as an input to the second flip-flop and the second multiplexer is coupled to the output of the first flip-flop and the second flip-flop.

2. The computer-readable medium of claim 1, wherein the second multiplexer is configured to receive a control signal which is low during a first shift cycle and is high in at least one shift cycle following the first shift cycle and during a capture mode during an operation of the circuit.

3. The computer-readable medium of claim 1, wherein the processing arrangement is further configured to perform a testing of the circuit by:
shifting out a content of the first flip-flop into a succeeding scan cell during at least one first shift cycle,
shifting out a content of the second flip-flop to the succeeding scan cell during at least one second shift cycle which follows the at least one first shift cycle,
capturing, at the first and second flip-flops, a response bit, and
receiving, at the second flip-flop, an input from a preceding scan cell during each shift cycle.

4. The computer-readable medium of claim 1, wherein the selecting procedure includes an iterative procedure, which comprises:
identifying a critical path of the circuit having a start point and an end point,
determining whether the start point and the end point are the same,
determining whether the scan cell at the end point includes a previous transformation, and
terminating the iterative procedure if it is determined that the start point and the end point are the same or if the scan cell at the end point was previously transformed.

5. The computer-readable medium of claim 4, wherein the iterative procedure further includes determining, whether the critical path is longer upon the transformation, and reverting to a prior state of the transformation and terminating the iterative procedure if it is determined that the critical path is longer upon the transformation.

6. The computer-readable medium of claim 4, wherein the start point and the end point include scan cells.

7. A system for transforming a circuit, comprising:
a non-transitory computer-readable medium including instructions thereon that are accessible by a hardware processing arrangement, wherein, when the processing arrangement executes the instructions, the processing arrangement is configured to perform procedures comprising:
selecting, from the circuit, at least one scan cell which includes a first multiplexer coupled to a first flip-flop; and
inserting a second flip-flop and a second multiplexer in the circuit,
wherein the first multiplexer is coupled as an input to the second flip-flop and the second multiplexer is coupled to the output of the first flip-flop and the second flip-flop.

8. The system of claim 7, wherein the second multiplexer is configured to receive a control signal which is low during a first shift cycle and is high in at least one shift cycle following the first shift cycle and during a capture mode during an operation of the circuit.

9. The system of claim 7, wherein the processing arrangement is further configured to perform a testing of the circuit by:
shifting out a content of the first flip-flop into a succeeding scan cell during at least one first shift cycle,
shifting out a content of the second flip-flop to the succeeding scan cell during at least one second shift cycle which follows the at least one first shift cycle,
capturing, at the first and second flip-flops, a response bit, and
receiving, at the second flip-flop, an input from a preceding scan cell during each shift cycle.

10. The system of claim 7, wherein the selecting procedure includes an iterative procedure, which comprises:
identifying a critical path of the circuit having a start point and an end point,
determining whether the start point and the end point are the same,
determining whether the scan cell at the end point includes a previous transformation, and
terminating the iterative procedure if it is determined that the start point and the end point are the same or if the scan cell at the end point was previously transformed.

11. The system of claim 10, wherein the iterative procedure further includes determining whether the critical path is longer upon the transformation, and reverting to a prior state of the transformation and terminating the iterative procedure if it is determined that the critical path is longer upon the transformation.

12. The computer-readable medium of claim 10, wherein the start point and the end point include scan cells.

13. A method for transforming a circuit, comprising:
selecting, from the circuit, at least one scan cell which includes a first multiplexer coupled to a first flip-flop; and
inserting a second flip-flop and a second multiplexer in the circuit,
wherein the first multiplexer is coupled as an input to the second flip-flop and the second multiplexer is coupled to the output of the first flip-flop and the second flip-flop.

14. The method of claim 13, wherein the second multiplexer is configured to receive a control signal which is low during a first shift cycle and is high in at least one shift cycle following the first shift cycle and during a capture mode during an operation of the circuit.

15. The method of claim 13, further comprising:
shifting out a content of the first flip-flop into a succeeding scan cell during at least one first shift cycle,
shifting out a content of the second flip-flop to the succeeding scan cell during at least one second shift cycle which follows the at least one first shift cycle,
capturing, at the first and second flip-flops, a response bit, and
receiving, at the second flip-flop, an input from a preceding scan cell during each shift cycle.

16. The method of claim 13, wherein the selecting procedure includes an iterative procedure, which comprises:
identifying a critical path of the circuit having a start point and an end point,
determining whether the start point and the end point are the same,
determining whether the scan cell at the end point includes a previous transformation, and
terminating the iterative procedure if it is determined that the start point and the end point are the same or if the scan cell at the end point was previously transformed.

17. The method of claim 16, wherein the iterative procedure further includes determining whether the critical path is longer upon the transformation, and reverting to a prior state of the transformation and terminating the iterative procedure if it is determined that the critical path is longer upon the transformation.

18. The method of claim 16, wherein the start point and the end point include scan cells.

* * * * *